(12) United States Patent
Chang et al.

(10) Patent No.: US 7,648,869 B2
(45) Date of Patent: Jan. 19, 2010

(54) METHOD OF FABRICATING SEMICONDUCTOR STRUCTURES FOR LATCH-UP SUPPRESSION

(75) Inventors: Shunhua Thomas Chang, South Burlington, VT (US); Toshiharu Furukawa, Essex Junction, VT (US); Robert J. Gauthier, Jr., Hinesburg, VT (US); David Vaclav Horak, Essex Junction, VT (US); Charles William Koburger, III, Delmar, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 11/330,689

(22) Filed: Jan. 12, 2006

(65) Prior Publication Data

US 2007/0158755 A1    Jul. 12, 2007

(51) Int. Cl.
*H01L 21/8238* (2006.01)
(52) U.S. Cl. .................. 438/199; 438/294; 438/296; 438/424; 257/E21.632
(58) Field of Classification Search .................. None
See application file for complete search history.

(56) References Cited

U.S. PATENT DOCUMENTS

| | | | |
|---|---|---|---|
| 4,454,647 A | 6/1984 | Joy et al. | |
| 4,495,025 A | 1/1985 | Haskell | |
| 4,609,934 A | 9/1986 | Haskell | |
| 4,615,104 A | 10/1986 | Kameyama et al. | |
| 4,948,624 A | 8/1990 | Rivaud et al. | |
| 4,956,693 A | 9/1990 | Sawahata et al. | |
| 5,015,594 A | 5/1991 | Chu et al. | |
| 5,112,771 A | 5/1992 | Ishii et al. | |
| 5,130,268 A | 7/1992 | Liou | |

(Continued)

FOREIGN PATENT DOCUMENTS

JP    04037152    2/1992

(Continued)

OTHER PUBLICATIONS

Cannon, Ethan Harrison, et al., Related U.S. Appl. No. 11/360,345, filed Feb. 23, 2006.

(Continued)

*Primary Examiner*—Alonzo Chambliss
(74) *Attorney, Agent, or Firm*—Wood, Herron & Evans, LLP

(57) ABSTRACT

Semiconductor structures and methods for suppressing latch-up in bulk CMOS devices. The structure comprises a first doped well formed in a substrate of semiconductor material, a second doped well formed in the substrate proximate to the first doped well, and a deep trench defined in the substrate. The deep trench includes sidewalls positioned between the first and second doped wells. A buried conductive region is defined in the semiconductor material bordering the base and the sidewalls of the deep trench. The buried conductive region intersects the first and second doped wells. The buried conductive region has a higher dopant concentration than the first and second doped wells. The buried conductive region may be formed by solid phase diffusion from a mobile dopant-containing material placed in the deep trench. After the buried conductive region is formed, the mobile dopant-containing material may optionally remain in the deep trench.

12 Claims, 6 Drawing Sheets

U.S. PATENT DOCUMENTS

| | | |
|---|---|---|
| 5,183,775 A | 2/1993 | Levy |
| 5,393,693 A | 2/1995 | Ko et al. |
| 5,445,989 A | 8/1995 | Lur et al. |
| 5,536,675 A | 7/1996 | Bohr |
| 5,658,816 A | 8/1997 | Rajeevakumar |
| 5,783,476 A | 7/1998 | Arnold |
| 5,807,784 A | 9/1998 | Kim |
| 5,844,294 A | 12/1998 | Kikuchi |
| 5,895,251 A | 4/1999 | Kim |
| 5,895,253 A | 4/1999 | Akram |
| 5,937,286 A | 8/1999 | Abiko |
| 5,972,776 A | 10/1999 | Bryant |
| 5,994,200 A | 11/1999 | Kim |
| 6,001,709 A | 12/1999 | Chuang et al. |
| 6,018,174 A | 1/2000 | Schrems et al. |
| 6,137,152 A | 10/2000 | Wu |
| 6,207,532 B1 | 3/2001 | Lin et al. |
| 6,214,696 B1 | 4/2001 | Wu |
| 6,294,419 B1 | 9/2001 | Brown et al. |
| 6,365,952 B1 | 4/2002 | Akram |
| 6,432,798 B1 | 8/2002 | Liu et al. |
| 6,455,363 B1 | 9/2002 | Puchner et al. |
| 6,476,445 B1 | 11/2002 | Brown et al. |
| 6,518,641 B2 | 2/2003 | Mandelman et al. |
| 6,576,558 B1 | 6/2003 | Lin |
| 6,590,271 B2 | 7/2003 | Liu et al. |
| 6,635,543 B2 | 10/2003 | Furukawa et al. |
| 6,645,835 B1 | 11/2003 | Yamoto et al. |
| 6,653,678 B2 * | 11/2003 | Chidambarrao et al. ..... 257/301 |
| 6,670,234 B2 * | 12/2003 | Hsu et al. .................. 438/246 |
| 6,689,655 B2 | 2/2004 | Coronel et al. |
| 6,828,191 B1 | 12/2004 | Wurster et al. |
| 6,830,962 B1 | 12/2004 | Guarini et al. |
| 6,875,663 B2 | 4/2005 | Iwamatsu et al. |
| 6,900,091 B2 | 5/2005 | Williams et al. |
| 6,903,384 B2 | 6/2005 | Hsu et al. |
| 6,905,944 B2 | 6/2005 | Chudzik et al. |
| 6,984,580 B2 | 1/2006 | Dostalik et al. |
| 6,995,054 B2 | 2/2006 | Oda et al. |
| 7,045,397 B1 | 5/2006 | Yu et al. |
| 7,078,324 B2 | 7/2006 | Dudek et al. |
| 7,081,378 B2 * | 7/2006 | Zheng et al. ................ 438/135 |
| 7,122,867 B2 | 10/2006 | Liou |
| 7,176,104 B1 | 2/2007 | Chen et al. |
| 7,276,768 B2 | 10/2007 | Furukawa et al. |
| 7,491,618 B2 * | 2/2009 | Furukawa et al. ........... 438/361 |
| 2003/0017710 A1 | 1/2003 | Yang et al. |
| 2003/0170964 A1 | 9/2003 | Kao et al. |
| 2004/0033666 A1 | 2/2004 | Williams et al. |
| 2004/0102017 A1 | 5/2004 | Chang et al. |
| 2005/0004595 A1 | 1/2005 | Boyle et al. |
| 2005/0020003 A1 | 1/2005 | Johansson et al. |
| 2005/0045952 A1 | 3/2005 | Chatty et al. |
| 2005/0064678 A1 | 3/2005 | Dudek et al. |
| 2005/0085028 A1 | 4/2005 | Chatty et al. |
| 2005/0142803 A1 | 6/2005 | Chun |
| 2005/0179111 A1 | 8/2005 | Chao |
| 2005/0191812 A1 | 9/2005 | Pritchard et al. |
| 2006/0003596 A1 | 1/2006 | Fucsko et al. |
| 2006/0065923 A1 | 3/2006 | Pfirsch |
| 2006/0113589 A1 | 6/2006 | Jones |
| 2006/0134882 A1 | 6/2006 | Zhang |
| 2007/0158755 A1 | 7/2007 | Chang et al. |
| 2007/0170518 A1 | 7/2007 | Furukawa et al. |
| 2007/0170543 A1 | 7/2007 | Furukawa et al. |
| 2007/0241409 A1 | 10/2007 | Furukawa et al. |
| 2008/0057671 A1 | 3/2008 | Furukawa et al. |
| 2008/0157202 A1 | 7/2008 | Cannon et al. |
| 2008/0164494 A1 | 7/2008 | Pagette et al. |
| 2008/0203492 A1 | 8/2008 | Cannon et al. |
| 2008/0203522 A1 | 8/2008 | Mandelman et al. |
| 2008/0217690 A1 | 9/2008 | Mandelman et al. |
| 2008/0217698 A1 | 9/2008 | Furukawa et al. |
| 2008/0230852 A1 | 9/2008 | Yu et al. |
| 2008/0237663 A1 | 10/2008 | Hanafi |
| 2008/0242016 A1 | 10/2008 | Cannon et al. |
| 2008/0265338 A1 | 10/2008 | Yu et al. |
| 2008/0268610 A1 | 10/2008 | Furukawa et al. |

OTHER PUBLICATIONS

Cannon, Ethan Harrison, et al., Related U.S. Appl. No. 11/330,688, filed Jan. 12, 2006.

Furukawa, Toshiharu, et al., Related U.S. Appl. No. 11/340,752, filed Jan. 26, 2006.

Furukawa, Toshiharu, et al., Related U.S. Appl. No. 11/340,737, filed Jan. 26, 2006.

Office Action issued in related U.S. Appl. No. 11/340,737; dated Mar. 27, 2007; 5 pages; USPTO.

Notice of Allowance issued in related U.S. Appl. No. 11/340,737; dated Jun. 1, 2007; 4 pages; USPTO.

Office Action issued in related U.S. Appl. No. 11/340,752; dated Jun. 17, 2008; 35 pages; USPTO.

M. Yang et al., "High Performance CMOS Fabricated on Hybrid Substrate With Different Crystal Orientations," IEEE, 2003 (4 pages).

M. Yang et al., "On the Integration of CMOS with Hybrid Crystal Orientations," IEEE, 2004 Symposium on VLSI Technology Digest of Technical Papers (2 pages).

U.S. Patent and Trademark Office, Office Action dated as mailed on Feb. 5, 2009 for related U.S. Appl. No. 11/330,688, 13 pages.

U.S. Patent and Trademark Office, Office Action dated as mailed on Nov. 14, 2008 for related U.S. Appl. No. 12/125,381, 12 pages.

U.S. Patent and Trademark Office, Office Action dated as mailed on Nov. 28, 2008 for related U.S. Appl. No. 11/927,135, 10 pages.

U.S. Patent and Trademark Office, Office Action dated as mailed on Dec. 12, 2008 for related U.S. Appl. No. 12/169,806, 10 pages.

"Oxidation", Apr. 11, 2005, http://www.answers.com/topic/oxidation, definition 1, 4 pages.

"Oxidation and Reduction", Dec. 25, 2003, http://hyperphysics.phy-ast.gsu.edu/HBASE/chemical/oxred.html, 4 pages.

U.S. Patent and Trademark Office, Office Action dated as mailed on Feb. 19, 2009 for related U.S. Appl. No. 11/680,083, 15 pages.

U.S. Patent and Trademark Office, Office Action dated as mailed on Mar. 10, 2009 for related U.S. Appl. No. 11/360,345, 8 pages.

U.S. Patent and Trademark Office, Office Action dated as mailed on Mar. 11, 2009 for related U.S. Appl. No. 12/117,232, 14 pages.

U.S. Patent and Trademark Office, Office Action dated as mailed on Apr. 7, 2009 for related U.S. Appl. No. 11/764,571.

J. Ruzyllo. Semiconductor Glossary [online], [retrieved on Nov. 12, 2008]. Retrieved from the Internet <URL: http://www.semiconductorglossary.com/default.asp?searchterm=channel+stop>.

Notice of Allowance issued in a related U.S. Appl. No. 11/340,752; dated as mailed on Oct. 3, 2008; 6 pages; U.S. Patent and Trademark Office.

Office Action issued in a related U.S. Appl. No. 11/330,688; dated as mailed on Aug. 12, 2008; 12 pages; U.S. Patent and Trademark Office.

J. Ruzyllo. Semiconductor Glossary [online], [retrieved on Nov. 12, 2008]. Retrieved from the Internet <URL: http://www.semiconductorglossary.com/default.asp?searchterm=sub-collector+contact>.

Office Action issued in a related U.S. Appl. No. 11/330,688; dated as mailed on Aug. 12, 2008; 12 pages; U.S. Patent and Trademark Office.

Office Action issued in a related U.S. Appl. No. 11/360,345, dated Aug. 29, 2008; 12 pages; U.S. Patent and Trademark Office.

Notice of Allowance issued in a related U.S. Appl. No. 11/340,752; dated as mailed on Oct. 3, 2008; 6 pages; U.S. Patent and Trademark Office.

J. Ruzyllo, Semiconductor Glossary [online], [retrieved on Nov. 12, 2008]. Retrieved from the Internet <URL: http://www.semiconductorglossary.com/default.asp?searchterm=sub-collector+contact>.

J. Ruzyllo, Semiconductor Glossary [online], [retrieved on Nov. 12, 2008]. Retrieved from the Internet <URL: http://www.semiconductorglossary.com/default.asp?searchterm=channel+stop>.

U.S. Patent and Trademark Office, Office Action dated as mailed on Feb. 13, 2008 for related U.S. Appl. No. 11/360,345.

U.S. Patent and Trademark Office, Office Action dated as mailed on May 12, 2009 for related U.S. Appl. No. 11/927,135.

U.S. Patent and Trademark Office, Office Action dated as mailed on May 6, 2009 for related U.S. Appl. No. 12/125,381, 12 pages.

U.S. Patent and Trademark Office, Office Action dated as mailed on Jun. 22, 2009 for related U.S. Appl. No. 12/169,806.

U.S. Patent and Trademark Office, Office Action dated as mailed on Jul. 2, 2009 for related U.S. Appl. No. 11/330,688.

U.S. Patent and Trademark Office, Notice of Allowance dated as mailed on Sep. 28, 2009 for related U.S. Appl. No. 11/764,571.

U.S. Patent and Trademark Office, Notice of Allowance dated as mailed on Aug. 25, 2009 for related U.S. Appl. No. 11/927,135.

U.S. Patent and Trademark Office, Notice of Allowance dated as mailed on Sep. 14, 2009 for related U.S. Appl. No. 12/125,381.

U.S. Patent and Trademark Office, final Office Action dated as mailed on Oct. 9, 2009 for related U.S. Appl. No. 11/680,083,.

* cited by examiner

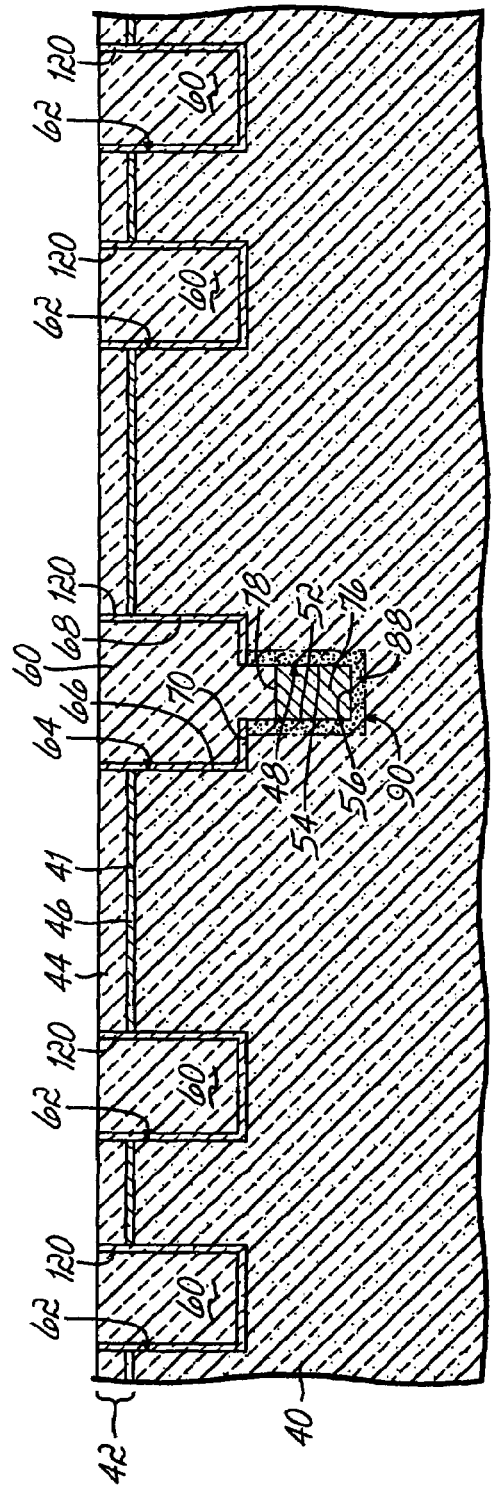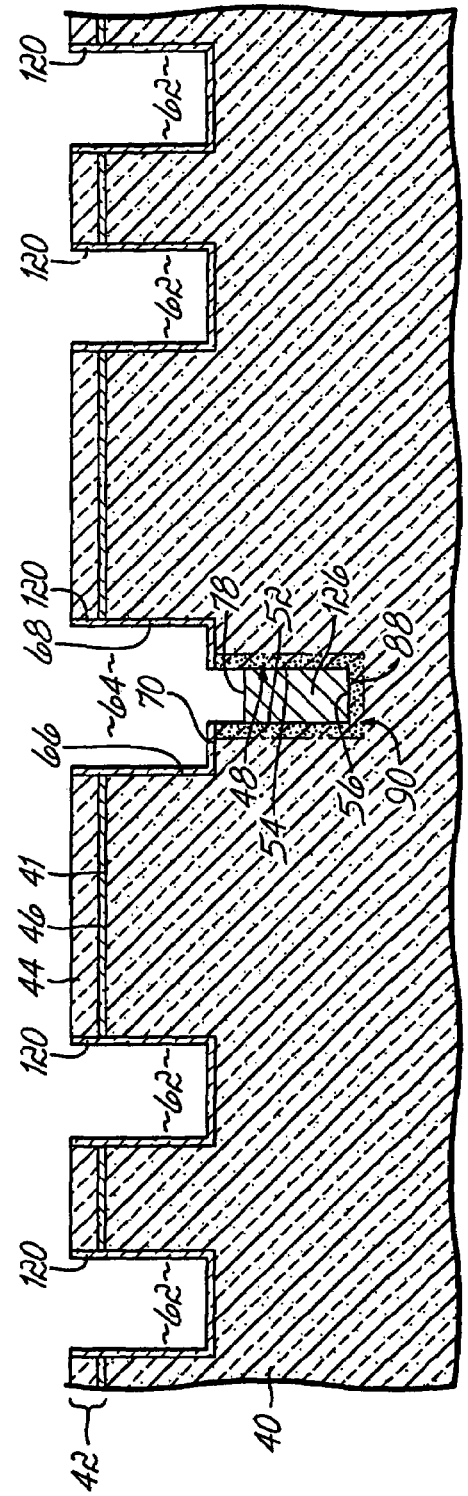
FIG. 7
FIG. 8

METHOD OF FABRICATING SEMICONDUCTOR STRUCTURES FOR LATCH-UP SUPPRESSION

FIELD OF THE INVENTION

The invention relates generally to semiconductor structures and methods and, in particular, to methods for reducing latch-up in bulk complementary metal-oxide-semiconductor device structures and semiconductor structures produced by these methods.

BACKGROUND OF THE INVENTION

Complementary metal-oxide-semiconductor (CMOS) technologies integrate P- and N-channel field effect transistors (FETs) to form an integrated circuit using a semiconductor substrate. Latch-up, which is precipitated by unwanted transistor action of parasitic bipolar transistors inherently present in bulk CMOS devices, may be a significant issue for bulk CMOS technologies. The unwanted parasitic transistor action, which has various triggers, may cause the bulk CMOS device to fail. For outer space based applications, latch-up may be induced by the impingement of high energy ionizing radiation and particles (e.g., cosmic rays, neutrons, protons, alpha particles). Because the integrated circuit cannot be easily replaced in space-based platforms, the chip failure may prove catastrophic. Hence, designing bulk CMOS devices with a high tolerance to latch-up is an important consideration for circuit operation in the natural space radiation environment, as well as military systems and high reliability commercial applications.

Bulk CMOS device designs may be adjusted to suppress latch-up. For example, latch-up may be suppressed in 0.25 micron device technologies by building bulk CMOS devices on epitaxial substrates (e.g., a p-type epitaxial layer on a highly-doped p-type substrate wafer). Highly-doped substrate wafers provide excellent current sinks for latch-up-initiating currents. However, epitaxial substrates are expensive to produce and may increase the design complexity of several critical circuits, such as electrostatic discharge (ESD) protective devices.

Another conventional approach for suppressing latch-up is the use of guard ring diffusions, which have various disadvantages. Guard ring diffusions are costly because they occupy a significant amount of active area silicon real estate. In addition, although guard ring diffusions collect a majority of the minority carriers in the substrate, a significant fraction may escape collection by flowing underneath the guard ring diffusion.

Semiconductor-on-insulator (SOI) substrates are recognized as generally free of latch-up. However, CMOS devices are expensive to fabricate using an SOI substrate, as compared to fabrication using bulk substrates. Furthermore, SOI substrates suffer from various other radiation-induced failure mechanisms aside from latch-up. Another disadvantage is that SOI devices do not generally come with a suite of ASIC books that would enable simple assembly of low-cost designs.

Conventional CMOS devices are susceptible to latch-up generally because of the close proximity of N-channel and P-channel devices. For example, a typical CMOS device fabricated on a p-type substrate includes a P-channel transistor fabricated in an N-well and an N-channel transistor fabricated in a P-well of opposite conductivity type to the N-well. The N- and P-wells are separated by only a short distance and adjoin across a junction. This densely-packed CMOS structure inherently forms a parasitic lateral bipolar (PNP) structure and parasitic vertical bipolar (NPN) structure. Latch-up may occur due to regenerative feedback between these NPN and PNP structures.

With reference to FIG. 1, a portion of a standard triple-well bulk CMOS structure 30 (i.e., CMOS inverter) includes a P-channel transistor 10 formed in an N-well 12 of a substrate 11, an N-channel transistor 14 formed in a P-well 16 of the substrate 11 that overlies a buried N-band 18, and a shallow trench isolation (STI) region 20 separating the N-well 12 from the P-well 16. Other STI regions 21 are distributed across the substrate 11. The N-channel transistor 14 includes n-type diffusions representing a source 24 and a drain 25. The P-channel transistor 10 has p-type diffusions representing a source 27 and a drain 28. The N-well 12 is biased at the standard power supply voltage ($V_{dd}$) and the P-well 16 is coupled to the substrate ground potential. The input of the CMOS structure 30 is connected to a gate 13 of the P-channel transistor 10 and to a gate 15 of the N-channel transistor 14. The output of CMOS structure 30 is connected to the drain 28 of the P-channel transistor 10 and the drain 25 of the N-channel transistor 14. The source 27 of the P-channel transistor 10 is connected to $V_{dd}$ and the source 24 of the N-channel transistor 14 is coupled to ground. Guard ring diffusions 34, 36 encircle the CMOS structure 30.

The n-type diffusions constituting the source 24 and drain 25 of the N-channel transistor 14, the isolated P-well 16, and the underlying N-band 18 constitute the emitter, base, and collector, respectively, of a vertical parasitic NPN structure 22. The p-type diffusions constituting the source 27 and drain 28 of the P-channel transistor 10, the N-well 12, and the isolated P-well 16 constitute the emitter, base, and collector, respectively, of a lateral parasitic PNP structure 26. Because the N-band 18 constitutes the collector of the NPN structure 22 and also the base of the PNP structure 26 and the P-well 16 constitutes the base of the NPN structure 22 and also the collector of the PNP structure 26, the parasitic NPN and PNP structures 22, 26 are wired to result in a positive feedback configuration.

A disturbance, such as impinging ionizing radiation, a voltage overshoot on the source 27 of the P-channel transistor 10, or a voltage undershoot on the source 24 of the N-channel transistor 14, may result in the onset of regenerative action. This results in negative differential resistance behavior and, eventually, latch-up of the bulk CMOS device. In latch-up, an extremely low-impedance path is formed between emitters of the vertical parasitic NPN structure 22 and the lateral parasitic PNP structure 26, as a result of the bipolar bases being flooded with carriers. The low-impedance state may precipitate catastrophic failure of that portion of the integrated circuit. The latched state may only be exited by removal of, or drastic lowering of, the power supply voltage below the holding voltage. Unfortunately, irreversible damage to the integrated circuit may occur almost instantaneously with the onset of the disturbance so that any reaction to exit the latched state is belated.

What is needed, therefore, is a structure and method for modifying standard bulk CMOS device designs that suppresses latch-up, while being cost effective to integrate into the process flow, and that overcomes the disadvantages of conventional bulk CMOS semiconductor structures and methods of manufacturing such semiconductor structures.

SUMMARY OF THE INVENTION

The present invention is generally directed to semiconductor structures and methods that suppress latch-up in standard bulk CMOS device designs, while retaining cost effectiveness for integration into the process flow forming the P-channel and N-channel field effect transistors characteristic of bulk CMOS devices.

In accordance with an embodiment of the present invention, a semiconductor structure for suppressing latch-up includes a first doped well formed in a substrate of a semiconductor material, a second doped well formed in the semiconductor material of the substrate proximate to the first doped well, and a deep trench defined in the semiconductor material of the substrate. The deep trench includes sidewalls coextensive with the first and second doped wells. A buried conductive region is defined in the semiconductor material bordering the base and the sidewalls of the deep trench. The buried conductive region intersects the first and second doped wells by lying partially inside the semiconductor material of the substrate doped to define the first and second doped wells. The buried conductive region has a higher dopant concentration than the first and second doped wells.

In another aspect of the present invention, a method is provided for fabricating a semiconductor structure in a substrate of semiconductor material. The method comprises forming a first doped well in the semiconductor material of the substrate, forming a second doped well in the semiconductor material of the substrate proximate to the first doped well, and forming a first trench with sidewalls extending in the semiconductor material of the substrate at a location between the first and second doped wells from a base toward a top surface of the substrate. The method further comprises introducing a dopant into the semiconductor material bounding the sidewalls and the base of the first trench to define a buried conductive region characterized by a higher dopant concentration than the first and second doped wells.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIG. 4A is a top view of the substrate portion at the fabrication stage of FIG. 4.

FIGS. 5-7 are diagrammatic views of a portion of a substrate at a fabrication stage of a processing method in accordance with an alternative embodiment of the present invention.

FIGS. 8-9 are diagrammatic views of a portion of a substrate at a fabrication stage of a processing method in accordance with an alternative embodiment of the present invention.

DETAILED DESCRIPTION

Figure 1:
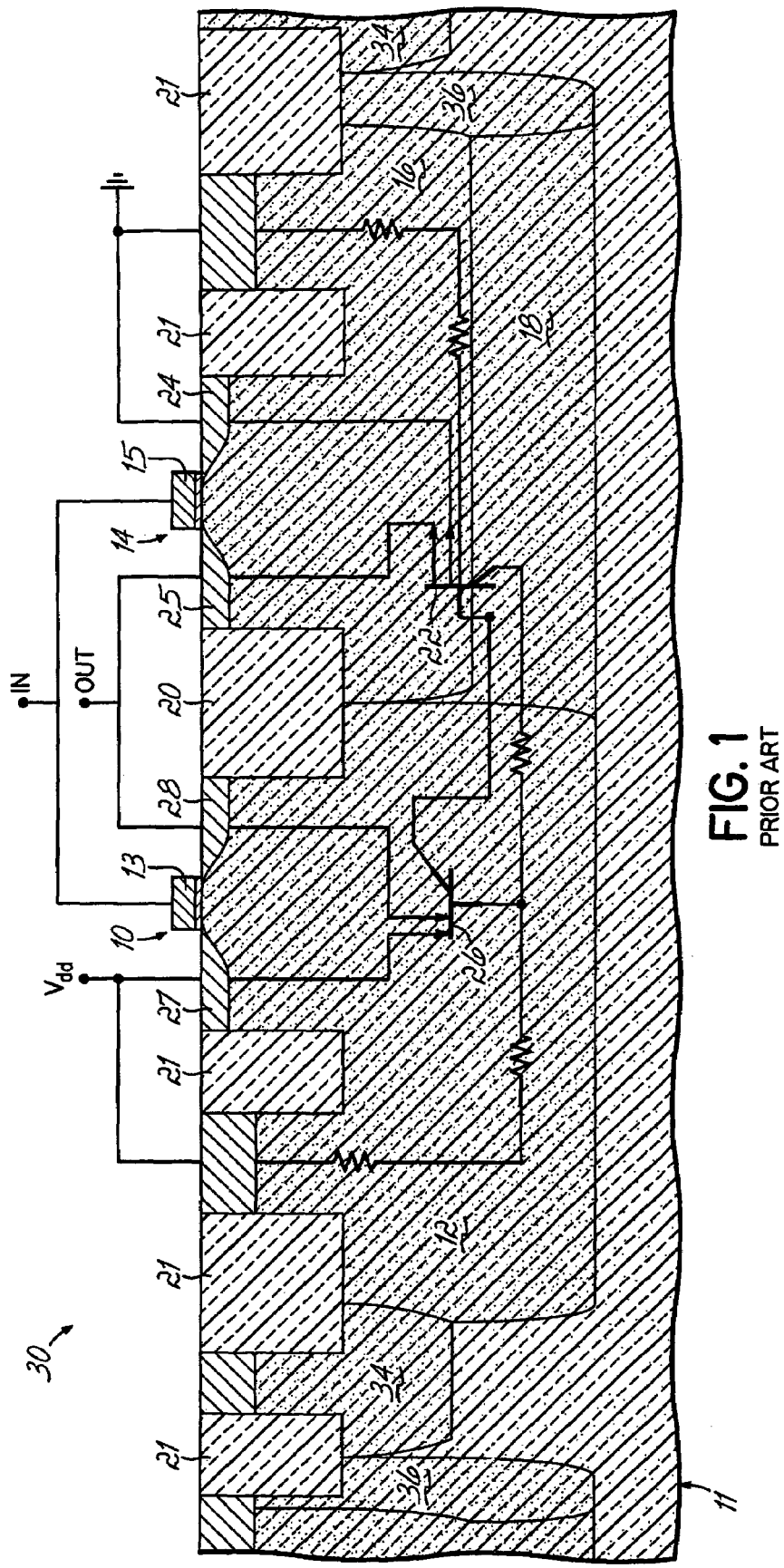
FIG. 1 is a diagrammatic view of a portion of a substrate with a bulk CMOS device constructed in accordance with the prior art.

The present invention provides a buried guard region that limits the effect of the vertical parasitic NPN structure and the lateral parasitic PNP structure responsible for latch-up in triple-well bulk complementary metal-oxide-semiconductor (CMOS) devices. The invention is advantageously implemented in the context of bulk CMOS devices in which pairs of N-channel and P-channel field effect transistors are formed adjacent to each other in a P-well within an N-band and an N-well, respectively, and the P-well is isolated from the N-well by a shallow trench isolation (STI) region. Specifically, latch-up in a standard bulk CMOS triple well structure is suppressed by the addition of a heavily doped n-type region (i.e., N-well strap) diffused into the semiconductor material bordering a deep vertical extension of the trench in which the STI region is formed. The N-well strap bridges the N-well and the N-band and has a higher dopant concentration than either the N-well or the N-band. Conductive material in the vertical extension may also contribute to latch-up suppression. The present invention will now be described in greater detail by referring to the drawings that accompany the present application.

Figure 2:
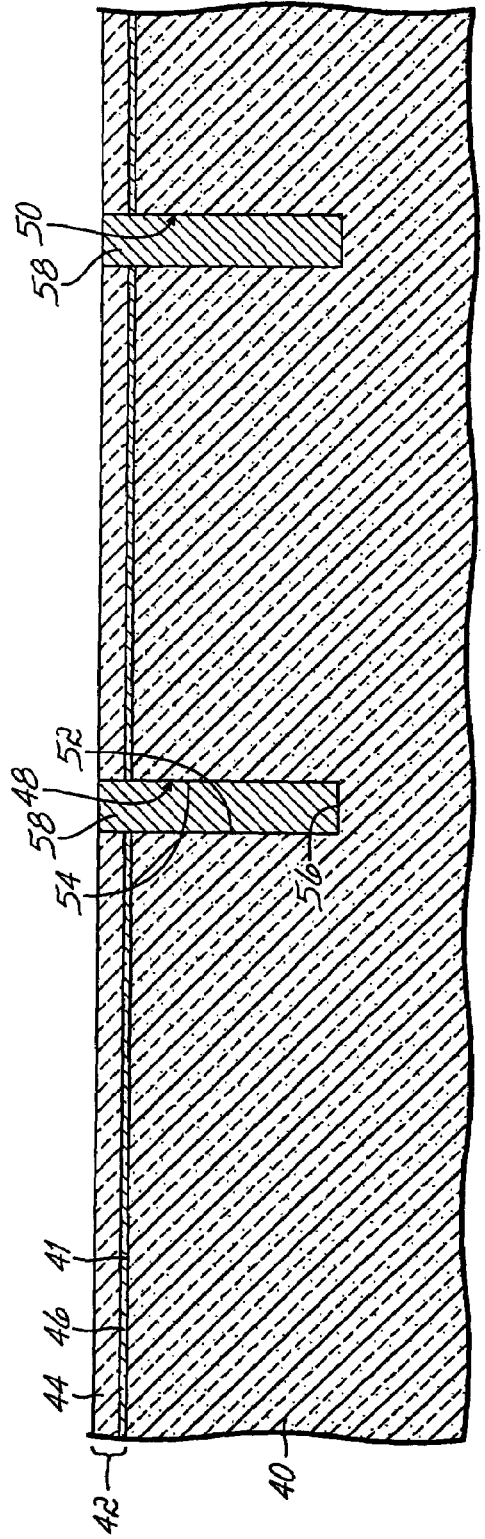
FIGS. 2-4 are diagrammatic views of a portion of a substrate at various fabrication stages of a processing method in accordance with an embodiment of the present invention.

With reference to FIG. 2, a bulk substrate 40 of a monocrystalline semiconductor material is obtained. Substrate 40 may include a low-defect epitaxial layer for device fabrication that is grown by an epitaxial growth process, such as a thermal chemical vapor deposition (CVD) process using a silicon source gas (e.g., silane). Substrate 40 may be a single crystal silicon wafer containing a relatively light concentration of a dopant providing p-type conductivity. For example, substrate 40 may be lightly doped with $5\times10^{15}$ cm$^{-3}$ to $1\times10^{17}$ cm$^{-3}$ of a p-type dopant, such as boron, by in situ doping during deposition of the epitaxial layer.

A pad structure 42 is formed on a top surface 41 of the substrate 40. The pad structure 42 includes a first pad layer 44 separated from the substrate 40 by a thinner second pad layer 46. The material(s) forming first pad layers 44, 46 advantageously etch selectively to the constituent semiconductor material of substrate 40. The first pad layer 44 may be a conformal layer of nitride ($Si_3N_4$) formed by a thermal CVD process like low pressure chemical vapor deposition (LPCVD) or a plasma-assisted CVD process. The second pad layer 46, which may be silicon oxide ($SiO_2$) grown by exposing substrate 40 to either a dry oxygen ambient or steam in a heated environment or deposited by a thermal CVD process, may operate as a buffer layer to prevent any stresses in the material constituting the first pad layer 44 from causing dislocations in the semiconductor material of substrate 40.

The pad layers 44, 46 of pad structure 42 are patterned by a conventional lithography and subtractive etching process and subsequently used to define a plurality of trenches, of which deep trenches 48, 50 are visible in FIG. 2, extending into the substrate 40 and distributed across the substrate 40. A trench pattern is defined in the pad structure 42 by a conventional lithography technique that applies a resist (not shown) across the surface of pad layer 44, exposes the resist to a pattern of radiation, and develops the transferred pattern in the exposed resist. An anisotropic dry etching process, such as reactive-ion etching (RIE) or plasma etching, is used to transfer the trench pattern from the patterned resist into the pad layers 44, 46. The chemistry of the etching process, which may be conducted in a single etching step or multiple steps, removes portions of the pad structure 42 visible through the trench pattern in the patterned resist and stops vertically on the substrate 40. Residual resist is stripped from the pad structure 42 by, for example, plasma ashing or a chemical stripper.

Deep trenches 48,50 are defined in substrate 40 using the patterned pad structure 42 by an anisotropic dry etching process, such as RIE or plasma etching, that relies on sidewall transfer. The subtractive etching process selectively removes unmasked constituent material of substrate 40, which is exposed through the patterned pad structure 42, without significantly removing the material of layers 44, 46. Deep trench 48 has opposite sidewalls 52, 54, which are substantially mutually parallel and oriented substantially perpendicular to the top surface 41 of substrate 40, that extend into the substrate 40 to a bottom surface or base 56. Deep trenches 48, 50 may have a depth, which is measured perpendicular to top surface 41, of about 0.5 µm to about 2.0 µm.

The deep trenches 48, 50 are filled by plugs 58 constituted by portions of a conformal layer of an appropriate conductor or conductive material, such as polycrystalline silicon (polysilicon) deposited conformally by a CVD process and in situ doped during the CVD process with a mobile dopant having, for example, an n-type conductivity. The mobile dopant in polysilicon may be, for example, arsenic or phosphorus. Although the invention is not so limited, persons having ordinary skill in the art can appreciate that arsenic may be advantageous for use in doping the conductive material of plugs 58 because of the relatively low diffusion rate for arsenic in silicon. The conductive material of the conformal layer overlying pad layer 44 is removed by a planarization process like a chemical-mechanical polishing (CMP) process. The top surface of pad layer 44 acts as a vertical polish stop for the planarization process.

Figure 3:
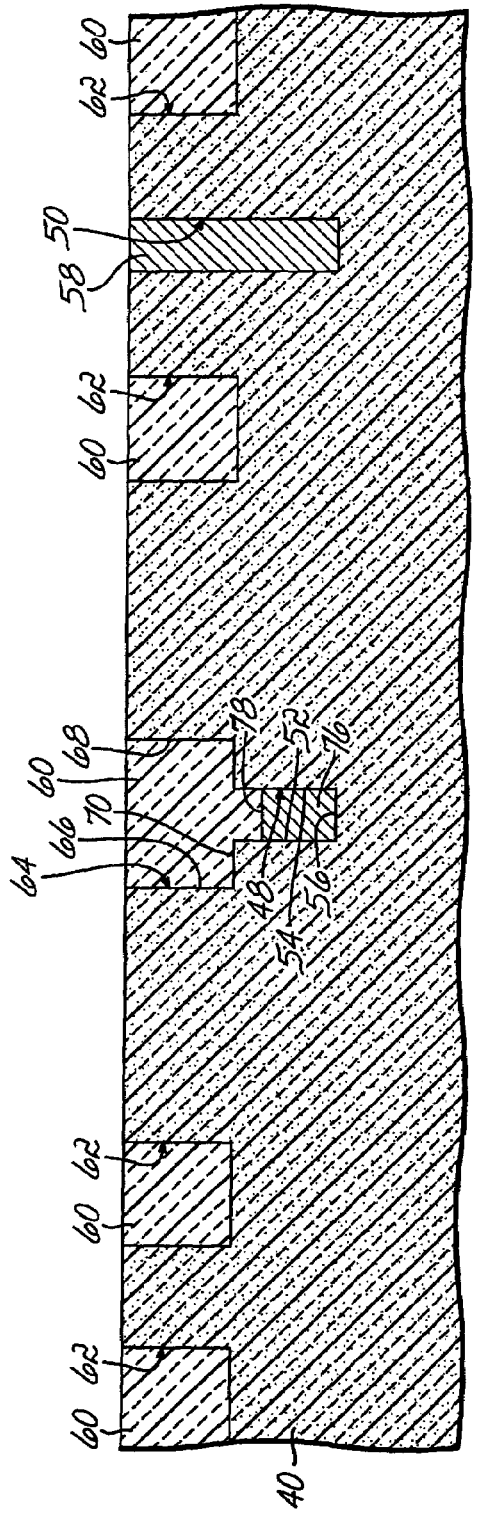

With reference to FIG. 3 in which like reference numerals refer to like features in FIG. 2 and at a subsequent fabrication stage, the planarized plug 58 in deep trench 48 is recessed relative to the top surface 41 of substrate 40 by, for example, an anisotropic dry etching process. If constituent material of the plugs 58 is n-type polysilicon, a standard fluorine-based dry etching process may be used to recess plugs that is selective to the material of pad layer 44 (FIG. 2). A block mask (not shown) of, for example, patterned photoresist protects plug 58 in deep trench 50 against recess during the etching process.

Shallow trench isolation (STI) regions 60 are formed in the substrate 40 by, for example, a conventional patterning, etch, fill, and planarization process characteristic of standard bulk CMOS processing. The STI regions 60 may be formed using a shallow trench pattern imparted in the pad structure 42 (FIG. 2) by a conventional lithography and subtractive etching process or a patterned hard mask (not shown) formed on pad structure 42. For example, the shallow trench pattern may be created in pad structure 42 by applying a photoresist (not shown) on pad layer 44, exposing the photoresist to a pattern of radiation to create a latent shallow trench pattern in the photoresist, developing the latent shallow trench pattern in the exposed photoresist, transferring the shallow trench pattern from the photoresist into pad layers 44, 46 of pad structure 42 with an anisotropic etching process, and stripping the photoresist to re-expose the patterned pad layer 44.

The shallow trench pattern is then transferred from the patterned pad structure 42 into the underlying substrate 40 with an anisotropic dry etching process. The anisotropic dry etching process may be constituted by, for example, RIE, ion beam etching, or plasma etching using an etch chemistry (e.g., a standard silicon RIE process) that removes the constituent material of substrate 40 selective to the material constituting the pad layers 44, 46. The shallow trench pattern in the substrate 40 consists of shallow trenches 62, which are substantially similar, and a shallow trench 64 that is registered with deep trench 48. Shallow trench 64 may have different dimensions than shallow trenches 62.

Shallow trench 64 includes opposite sidewalls 66, 68, which are substantially mutually parallel and oriented substantially perpendicular to the top surface 41 of substrate 40, that extend into the substrate 40 to a bottom surface or base 70. Shallow trench 64 has a depth, which is measured perpendicular to top surface 41 and is established by base 70, that is shallower than the base 56 of deep trench 48. As a result, deep trench 48 is partially preserved by the subtractive etching process forming shallow trench 64 such that the residual portion of the deep trench 48 defines a vertical extension of shallow trench 64, and the deep trench 48 and shallow trench 64 are contiguous. The sidewalls 66, 68 of shallow trench 64 are more widely separated than the sidewalls 52, 54 of deep trench 48. Consequently, shallow trench 64 has a different aspect ratio (i.e., the ratio of depth to width) than deep trench 48. Deep trench 48 has a relatively high aspect ratio and shallow trench 64 has a relatively low aspect ratio.

The subtractive etching process defining shallow trench 64 removes portions of the plug 58 (FIG. 2) residing in deep trench 48 to define a residual plug 76. A top surface 78 of the residual plug 76 is recessed to a depth slightly deeper than the base 70 of shallow trench 64. If the plug 58 in deep trench 48 is formed from doped polysilicon and the substrate 40 is formed from monocrystalline silicon, the recessing arises from the higher etch rate of polysilicon in comparison to monocrystalline silicon.

The shallow trench pattern, which includes shallow trenches 62, 64, is filled by amounts of an insulating or dielectric material, such as tetraethylorthosilicate (TEOS) or a high-density-plasma (HDP) oxide, deposited across the pad layer 44 and planarized by, for example, a CMP process. The pad structure 42 is removed and planarized to define the STI regions 60 by a planarization process that makes a top surface of the STI regions 60 substantially co-planar or flush with the top surface 41 of substrate 40. The open space in deep trench 48 overlying the residual plug 76 is filled by a portion of the dielectric material of the corresponding STI region 60.

Figure 4:
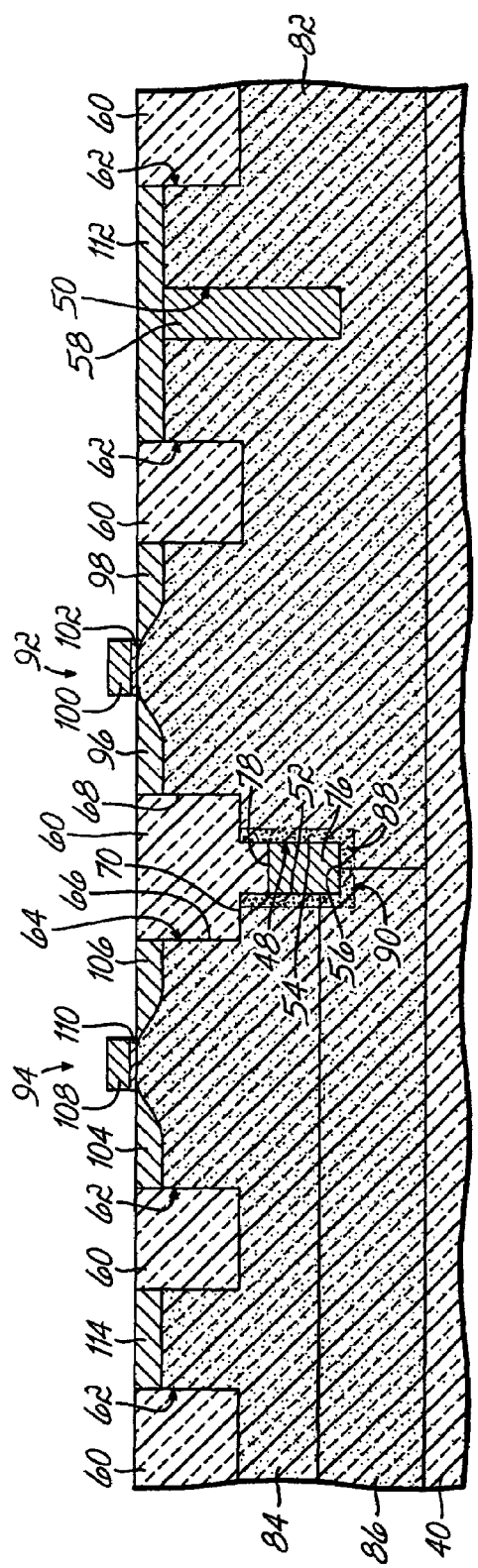

With reference to FIGS. 4 and 4A in which like reference numerals refer to like features in FIG. 3 and at a subsequent fabrication stage, standard bulk CMOS processing follows, which includes formation of a triple-well structure consisting of an N-well 82, a P-well 84, and a deep buried N-well or N-band 86 in the substrate 40. The buried N-band 86 supplies electrical isolation for the P-well 84. This triple-well construction permits the optimization of bias potentials for both N-and P-wells 82, 84. One or more contacts 80 (FIG. 4A) are formed in corresponding vias extending through the STI region 60 in shallow trench 64 to establish an electrical connection with the residual plug 76 for the application of an electrical bias to the residual plug 76. Optionally, contacts 80 may be omitted and the residual plug 76 may receive its bias via N-well 82.

The N-band 86, as well as other N-bands (not shown) dispersed across the substrate 40, are formed by patterning another mask layer (not shown) on top surface 41 and implanting an appropriate n-conductivity type impurity into the substrate 40 in this set of unmasked regions. The N-well 82, as well as other N-wells (not shown) dispersed across the substrate 40, are likewise formed by patterning a mask layer (not shown), such as a photoresist, on the top surface 41 with techniques known in the art and implanting an appropriate n-conductivity type impurity into the substrate 40 in unmasked regions. The P-well 84, as well as other P-wells (not shown) dispersed across the substrate 40, are likewise formed by patterning another mask layer (not shown) on top surface 41 and implanting an appropriate p-conductivity type impurity into the substrate 40 in this set of unmasked regions. Typically, the P-well 84 is formed by counterdoping the N-band 86 and has an opposite conductivity type from the N-well 82 and N-band 86. Generally, the dopant concentration in the N-well 82 ranges from about $5.0 \times 10^{17}$ cm$^{-3}$ to about $7.0\times10^{18}$ cm$^{-3}$, and the dopant concentration in the P-well 84 ranges from about $5.0\times10^{17}$ cm$^{-3}$ to about $7.0\times10^{18}$ cm$^{-3}$, and the dopant concentration in the N-band 86 ranges from about $5.0\times10^{17}$ cm$^{-3}$ to about $7.0\times10^{18}$ cm$^{-3}$. A thermal anneal may be required to electrically activate the implanted impurities operating as the p-type and n-type dopants.

The thermal anneal activating the dopants in N-well 82, P-well 84 and N-band 86, and other heated process stages to which the substrate 40 is subjected, may cause a portion of the n-type dopant in the conductive material of residual plug 76 to out-diffuse for a relatively short penetration depth into the semiconductor material of the substrate 40 bounding the deep trench 48. The resultant n$^+$-diffusion region of the mobile dopant defines a doped strap 88 surrounding at least a portion of the deep trench 48. Alternatively, a separate thermal drive-in anneal may be performed at a selected temperature that is dedicated to forming the doped strap 88 by out-diffusion from residual plug 76. The dopant concentration of the doped strap 88 may be between about $5.0\times10^{19}$ cm$^{-3}$ and $1.0\times10^{20}$ cm$^{-3}$ and is higher than the dopant concentration in the N-well 82 or in the N-band 86. The residual plug 76 of conductive material and the doped strap 88 define a buried guard region 90 that operates to suppress latch-up because of the strategic positioning between N-well 82 and P-well 84 and the extension of the doped strap 88 into the N-well 82 and N-band 86 to intersect and bridge the N-well 82 and N-band 86 with a region of higher n-type dopant concentration.

A P-channel transistor 92 is built using the N-well 82 and an N-channel transistor 94 is built using the P-well 84 to define a bulk CMOS device. The P-channel transistor 92 includes p-type diffusions in the semiconductor material of substrate 40 representing a drain region 96 and a source region 98 that flank opposite sides of a channel region in the semiconductor material of substrate 40, a gate electrode 100 overlying the channel region, and a gate dielectric 102 electrically isolating the gate electrode 100 from the substrate 40. The N-channel transistor 94 includes n-type diffusions in the semiconductor material of substrate 40 representing a source 104 and a drain 106 that flank opposite sides of a channel region in the semiconductor material of substrate 40, a gate electrode 108 overlying the channel region, and a gate dielectric 110 electrically isolating the gate electrode 108 from the substrate 40. Other structures, such as sidewall spacers (not shown), may be included in the construction of the P-channel transistor 92 and the N-channel channel transistor 94.

The plug 58 in deep trench 50 may be used to form a contact to the N-well 82 or, if defined at a different location in the substrate 40, to the N-band 86. The STI region 60 in shallow trench 64 is located between the adjacent P-channel and N-channel transistors 92, 94 to provide mutual electrical isolation.

The conductor used to form the gate electrodes 100, 108 may be, for example, polysilicon, tungsten, or any other desired material deposited by a CVD process, etc. The drain and source regions 96, 98 and the source and drain regions 104, 106 may be formed in the semiconductor material of substrate 40 by ion implantation of suitable dopant species having an appropriate conductivity type. The gate dielectrics 102, 110 may comprise a any suitable dielectric or insulating material like silicon dioxide, silicon oxynitride, a high-k dielectric, or combinations of these dielectrics. The dielectric material constituting dielectrics 102, 110 may be between about 1 nm and about 10 nm thick, and may be formed by thermal reaction of the semiconductor material of the substrate 40 with a reactant, a CVD process, a physical vapor deposition (PVD) technique, or a combination thereof.

Processing continues to complete the semiconductor structure, including forming contacts to the gate electrodes 100, 108, drain region 96, source region 98, source region 104 and drain region 106. The contacts may be formed using any suitable technique, such as a damascene process in which an insulator is deposited and patterned to open vias, and then the vias are filled with a suitable conductive material, as understood by a person having ordinary skill in the art. The P-channel and N-channel transistors 92, 94 are coupled using the contacts with other devices on substrate 40 and peripheral devices with a multilevel interconnect structure consisting of conductive wiring and interlevel dielectrics (not shown). A contact 112 is also formed in substrate 40 that is electrically coupled with the N-well 82 for supplying the standard power supply voltage ($V_{dd}$) to the N-well 82. Another contact 114 is formed in substrate 40 for coupling the P-well 84 with the substrate ground potential.

In accordance with the principles of the invention, the buried guard region 90 is believed to suppress or significantly reduce the transport of minority carriers (i.e., holes) from the emitter (i.e., the drain region 96 and source region 98 of the P-channel transistor 92) of the lateral parasitic PNP structure 26 (FIG. 1) to the collector (i.e., P-well 84) of the PNP structure 26, which is believed to reduce the current gain (beta) of the PNP structure 26 to the point where latch-up is not sustained. Minority carriers from the emitter of the PNP structure 26 are steered by the buried guard region 90 toward the substrate 40, which is at the lowest electrical potential because of the doping gradient and the biasing voltages. Any remaining minority carriers traversing the base of the PNP structure 26 via the junction between the N-well 82 and N-band 86 beneath and outside of the buried guard region 90 have a longer path length (i.e., extended base width), which also reduces the bipolar gain of the PNP structure 26. Because the substrate 40 is at a lower electric potential than the buried guard region 90, a large fraction of the emitted minority carriers exit from the N-well 82 into the substrate 40 and, thus, never reach the P-well 84 (i.e., collector of the PNP structure 26). The doped strap 88 (i.e., N$^+$ outdiffusion) of the buried guard region 90 is believed to provide a region of short minority carrier lifetime for holes emitted from the emitter of PNP structure 26. The holes in the N-well 82 are believed to rapidly recombine because of the high doping concentration and long path. The residual plug 76 of conductive material (e.g., N$^+$ polysilicon) in the deep trench 48 supplies a current shunt that is believed to effectively recombine a major portion of the holes entering the plug 76.

Figure 5:
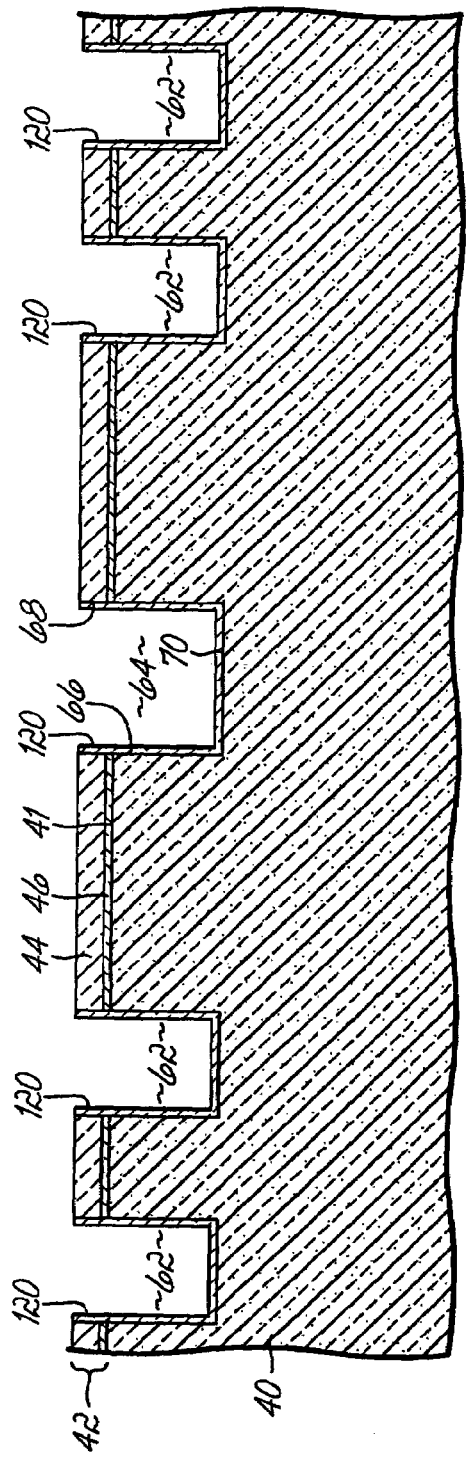

With reference to FIG. 5 in which like reference numerals refer to like features in FIGS. 2-4 and 4A and in accordance with an alternative embodiment of the present invention, the shallow trenches 62, 64 may be formed before the buried guard region 90 is formed. To that end, the shallow trenches 62, 64 are defined in substrate 40 as described with regard to FIG. 3. A pad structure 120 is formed on the sidewalls and base of shallow trenches 62 and also on the sidewalls 66, 68 and base 70 of shallow trench 64. The pad structure 120 may include a thin pad layer of a dielectric material, such as 1 nm to 3 nm of oxide thermally grown on the exposed silicon surfaces of the shallow trenches 62, 64, and a conformally deposited thin layer of a different dielectric materials, such as 4 nm to 20 nm of CVD nitride applied as a trench liner.

Figure 6:
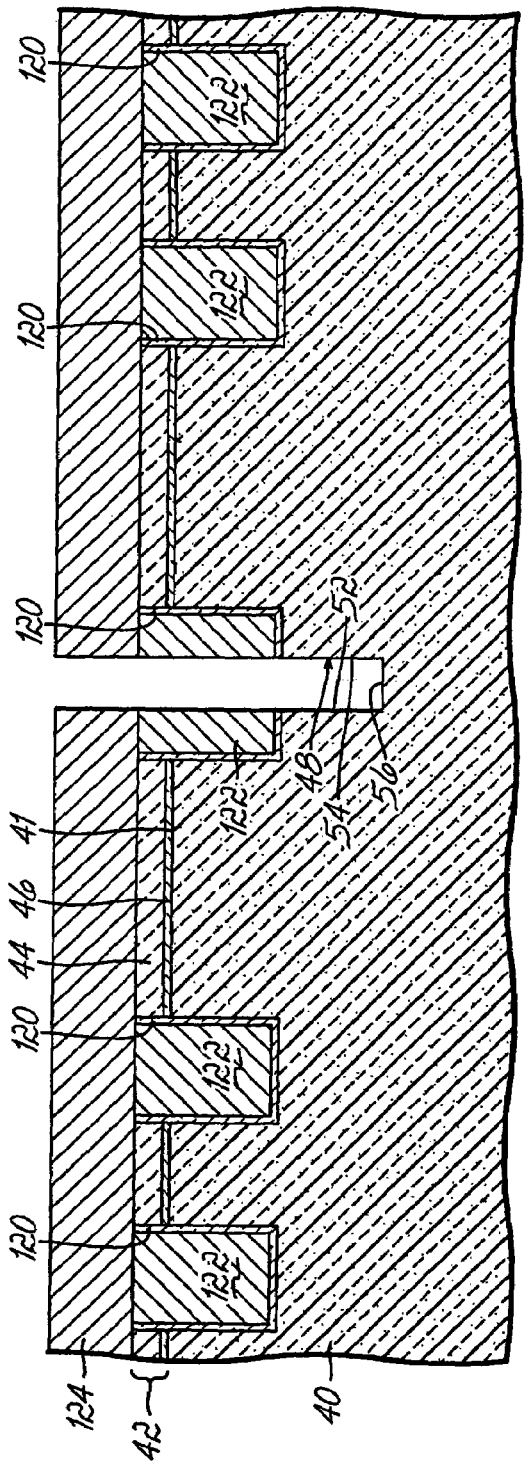

With reference to FIG. 6 in which like reference numerals refer to like features in FIG. 5 and at a subsequent fabrication stage, a planarizing resist 122 is applied to the substrate 40 that fills the shallow trenches 62, 64. The planarizing resist 122 is planarized by, for example, a CMP process to the top surface of the pad layer 44. After resist fill and planarization, a layer of photoresist 124 is applied and patterned with a mask characterized by unmasked regions correlated with the location of deep trench 48 and, optionally, deep trench 50. Using the patterned photoresist layer 124 as an etch mask, a dry anisotropic etch process is used to etch deep trench 48 and, optionally, deep trench 50 into the unmasked regions of the substrate 40.

With reference to FIG. 7 in which like reference numerals refer to like features in FIG. 6 and at a subsequent fabrication stage, the planarizing resist 122 (FIG. 6) and photoresist layer 124 (FIG. 6) are stripped by, for example, plasma ashing or a chemical stripper. The residual plug 76 of conductive material is defined by filling deep trench 48 with potions of a layer of the conductive material, planarizing, and recessing the planarized plug 58 (FIG. 2) in deep trench 48 to a depth below the base 70 of the STI region 60, which is similar to the methodology described above with regard to FIG. 2. The shallow trenches 62, 64 are filled with dielectric material to form the STI regions 60, as described above with regard to FIG. 3. The doped strap 88 is then formed by performing a thermal anneal to out-diffuse mobile dopant from the residual plug 76 into semiconductor material constituting the substrate 40 that bounds the deep trench 48.

With reference to FIG. 8 in which like reference numerals refer to like features in FIG. 6 and in accordance with an alternative embodiment of the present invention, the fabrication process may be modified such that the residual plug 76 is omitted in the completed semiconductor structure. In this alternative embodiment, the buried guard region 90 is formed exclusively from the doped strap 88. To that end, the planarizing resist 122 (FIG. 6) and photoresist layer 124 (FIG. 6) are stripped by, for example, plasma ashing or a chemical stripper. Subsequently, the bottom portion of the deep trench 48 is filled with a plug 126 consisting of an n-type doped glass, such as arsenic-doped glass (ASG). The n-type doped glass of plug 126 is deposited preferably by a CVD process and then wet etched back to leave portions of the n-type doped glass in the lower portion of the deep trench 48 as plug 126.

A high concentration of n-type dopant originating from the plug 126 is diffused from the n-type doped glass of plug 126 into the semiconductor material of substrate 40 bounding deep trench 48 by a solid phase diffusion process consisting of a thermal anneal at an elevated temperature. The resultant high impurity concentration diffused layer, which has a higher n-type dopant concentration than either the N-well 82 or N-band 86, serves as the doped strap 88. A diffusion cap oxide layer (not shown) may be applied on the top surface of plug 126, before the solid phase diffusion process, to prevent out-diffusion of the n-type dopant from the top of the plug 126. After the solid phase diffusion process is concluded, the plug 126 may be removed from the lower portion of the deep trench 48. For example, the n-type doped glass of plug 126 may then be removed by stripping using a wet etchant solution, such as a solution of buffered hydrofluoric acid. Optionally, the plug 126 may be left in place.

Figure 9:
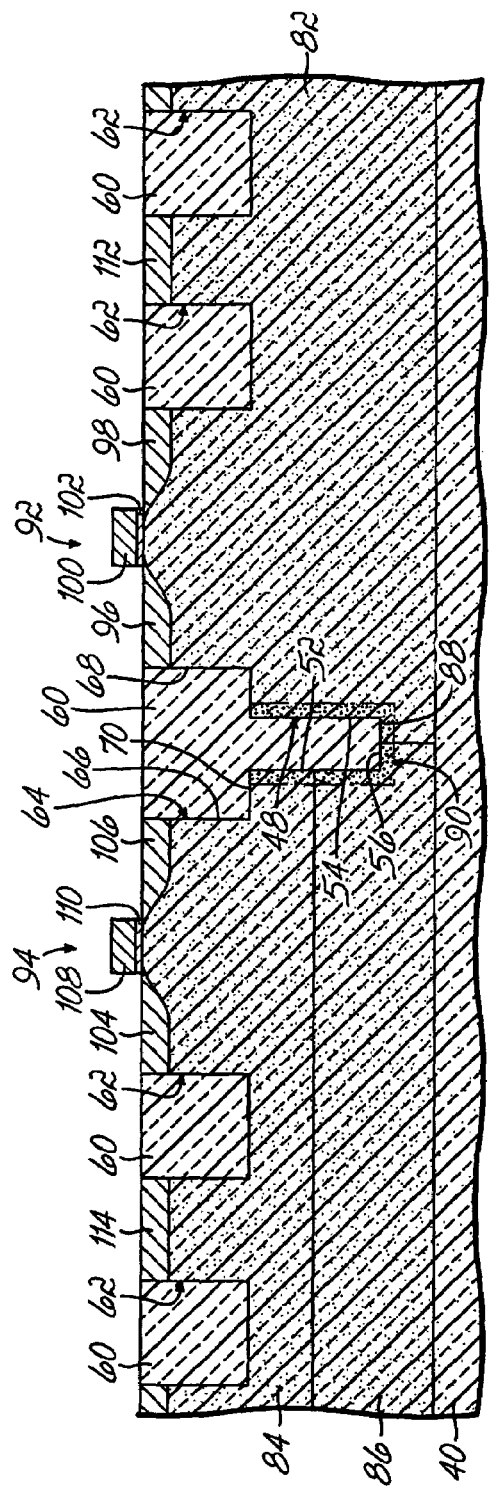

With reference to FIG. 9 in which like reference numerals refer to like features in FIG. 8 and at a subsequent fabrication stage, the isolation shallow trenches 62, 64 and, if the plug 126 is removed, deep trench 48 are filled with a dielectric material to form STI regions 60, as described above with regard to FIG. 3. The material filling deep trench 48 cooperates with the dielectric material in shallow trench 64 to define one of the STI regions 60. Conventional processing continues, as described above with regard to FIG. 4, to form transistors 92, 94, etc.

Figure 10:
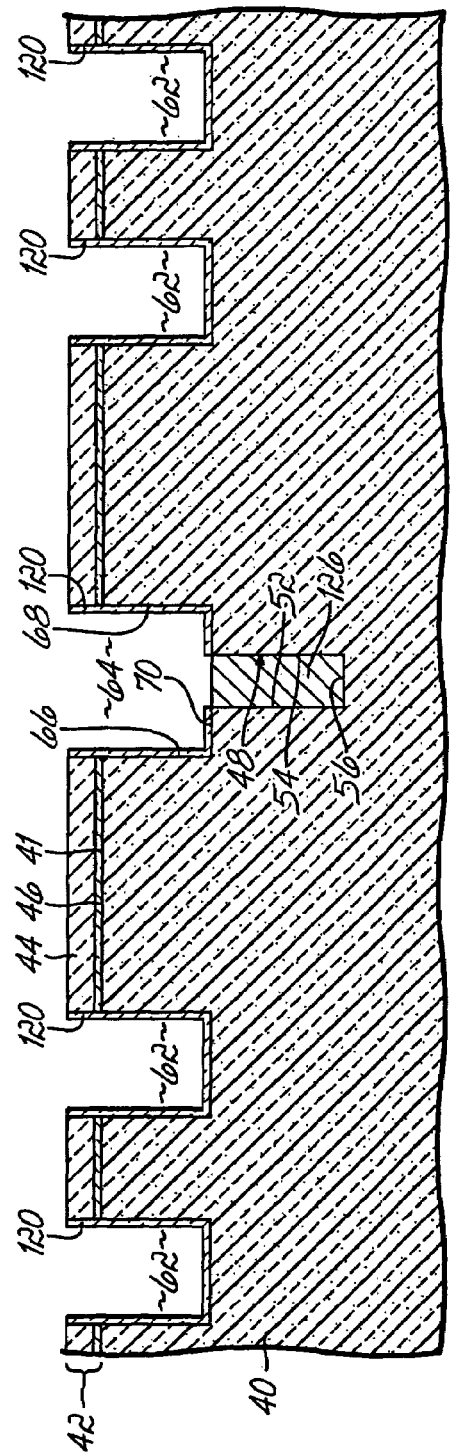
FIG. 10 is a diagrammatic view of a portion of a substrate at a fabrication stage of a processing method in accordance with an alternative embodiment of the present invention.

With reference to FIG. 10 in which like reference numerals refer to like features in FIG. 5 and in accordance with an alternative embodiment of the present invention, the fabrication process may be modified such that the deep trench 48 is filled with the plug 126 of n-type doped glass before the shallow trenches 62, 64 are formed. To that end, deep trench 48 is filled with a portion of a layer of n-type doped glass deposited on pad layer 44 across the substrate 40. The n-type doped glass in plug 126 is planarized by, for example, a CMP process to the top of the pad layer 44, which operates as a polish stop.

The shallow trenches 62, 64 for the STI regions 60 are then formed using a non-selective subtractive etching process, such as an $NF_3$-based dry etching process or a wet etching process. The etch rates of the n-type doped glass constituting plug 126 and monocrystalline silicon of substrate 40 are similar. The isolation shallow trenches 62, 64 are filled with a dielectric material to form STI regions 60, as described above with regard to FIG. 3. Processing continues, as described above with regard to FIGS. 8 and 9, to form the buried guard region 90 in the form of doped strap 88, STI regions 60, transistors 92, 94, etc. If plug 126 is removed, the dielectric material filling deep trench 48 cooperates with the dielectric material in shallow trench 64 to define one of the STI regions 60.

References herein to terms such as "vertical", "horizontal", etc. are made by way of example, and not by way of limitation, to establish a frame of reference. The term "horizontal" as used herein is defined as a plane parallel to the top surface 41 of substrate 40, regardless of its actual spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a semiconductor structure in a substrate of semiconductor material, the method comprising:
   forming a first doped well in the semiconductor material of the substrate;
   forming a second doped well in the semiconductor material of the substrate proximate to the first doped well;

forming a first trench with sidewalls extending in the semiconductor material of the substrate at a location between the first and second doped wells from a base toward a top surface of the substrate;

forming a second trench having sidewalls extending between the first and second wells and between the sidewalls of the first trench and the top surface;

at least partially filling the first trench with a material containing a mobile dopant;

thermally diffusing the mobile dopant from the material into the semiconductor material adjacent to the sidewalls of the first trench and into the semiconductor material adjacent to the base of the first trench to define a buried conductive region having a higher dopant concentration than the first and second doped wells; and filling at least the second trench with a dielectric material.

2. The method of claim 1 further comprising:

after the thermal diffusion of the mobile dopant, removing the mobile dopant-containing material from the first trench.

3. The method of claim 2 wherein the material comprises an n-type doped glass, and removing the n-type doped glass from the first trench further comprises:

etching the n-type doped glass with an etchant solution.

4. The method of claim 3 further comprising:

filling the first trench with a portion of the dielectric material after the n-type doped glass is removed.

5. The method of claim 1 wherein the mobile dopant-containing material is composed of a conductive material, and further comprising:

filling a portion of the first trench between the conductive material and the top surface that is unfilled by the conductive material with a portion of the dielectric material.

6. The method of claim 1 wherein the first trench is formed before the second trench, and at least partially filling the first trench with the material containing the mobile dopant further comprises:

when the second trench is formed, removing a portion of the mobile dopant-containing material to leave the first trench at least partially filled with the mobile dopant-containing material.

7. The method of claim 1 wherein the first trench is formed after the second trench, and at least partially filling the first trench with the material containing the mobile dopant further comprises:

filling the first and second trenches with the mobile dopant-containing material; and before thermally diffusing the mobile dopant, removing the mobile dopant-containing material from the second trench.

8. The method of claim 7 further comprising:

removing a portion of the mobile dopant-containing material from the first trench when the mobile dopant-containing material is removed from the second trench; and partially filling the first trench between the mobile dopant-containing material in the first trench and the base of the second trench with the dielectric material.

9. The method of claim 1 wherein diffusing the mobile dopant further comprises:

heating the mobile dopant-containing material to a temperature effective to diffuse the mobile dopant from the mobile dopant-containing material into the semiconductor material bounding the sidewalls and the base of the first trench.

10. The method of claim 1 further comprising:

forming a third trench extending into the first doped well simultaneously with the formation of the first trench.

11. The method of claim 10 wherein the mobile dopant-containing material is composed of a conductive material, and further comprising:

when the first trench is at least partially filled with the conductive material, at least partially filling the third trench with the conductive material.

12. The method of claim 1 wherein the first doped well and the second doped well have a first conductivity type, and further comprising:

forming a third doped well of a second conductivity type that differs from the first conductivity type in the substrate between the first doped well and the top surface;

forming doped source and drain regions of a first field effect transistor in the second doped well; and forming doped source and drain regions of a second field effect transistor in the third doped well.

\* \* \* \* \*

UNITED STATES PATENT AND TRADEMARK OFFICE
CERTIFICATE OF CORRECTION

PATENT NO. : 7,648,869 B2  Page 1 of 1
APPLICATION NO. : 11/330689
DATED : January 19, 2010
INVENTOR(S) : Chang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 732 days.

Signed and Sealed this

Twenty-eighth Day of December, 2010

David J. Kappos
*Director of the United States Patent and Trademark Office*